US005652084A

United States Patent [19]
Cleeves

[11] Patent Number: 5,652,084
[45] Date of Patent: Jul. 29, 1997

[54] METHOD FOR REDUCED PITCH LITHOGRAPHY

[75] Inventor: James M. Cleeves, Redwood City, Calif.

[73] Assignee: Cypress Semiconductor Corporation, Calif.

[21] Appl. No.: 740,145

[22] Filed: Oct. 22, 1996

Related U.S. Application Data

[63] Continuation of Ser. No. 361,595, Dec. 22, 1994, abandoned.

[51] Int. Cl.$^6$ .................................................. G03F 7/20
[52] U.S. Cl. .................. 430/315; 430/313; 430/328; 430/330
[58] Field of Search ................... 430/311, 313, 430/315, 324, 328, 330

[56] References Cited

U.S. PATENT DOCUMENTS

| | | | |
|---|---|---|---|
| 4,548,688 | 10/1985 | Matthews | 430/325 |
| 4,775,609 | 10/1988 | McFarland | 430/325 |
| 4,814,243 | 3/1989 | Ziger | 430/30 |
| 4,826,756 | 5/1989 | Orvek | 430/328 |
| 4,859,573 | 8/1989 | Maheras et al. | 430/326 |
| 4,904,866 | 2/1990 | Collins | 250/492.2 |
| 4,908,656 | 3/1990 | Suwa et al. | 355/53 |
| 4,931,351 | 6/1990 | McColgin | 430/323 |
| 4,985,374 | 1/1991 | Tsuji et al. | 430/229 |
| 5,158,910 | 10/1992 | Cooper et al. | 437/195 |
| 5,219,787 | 6/1993 | Carey et al. | 437/187 |
| 5,270,236 | 12/1993 | Rosner | 437/48 |
| 5,300,403 | 4/1994 | Angelopolus | 430/325 |
| 5,319,247 | 6/1994 | Matsuura | 257/760 |
| 5,320,932 | 6/1994 | Haraguchi et al. | 430/312 |
| 5,352,630 | 10/1994 | Kim et al. | 437/195 |

OTHER PUBLICATIONS

Fukase, et al, "A Margin–Free Contact Process Using An Al$_2$O$_3$ Etch–Stop Layer For High Density Devices", IEDM, Apr. 1992, pp. 837–840.

Ueno, et al., "A High Quarter–Micron Planarized Interconnection Technology with Self–Aligned Plug", IEDM, Apr. 1992, pp. 305–308.

Kusters, et al., "A High Density 4Mbit dRAM Process Using A Fully Overlapping Bitline Contact (FoBIC) Trench Cell", 1987 *Symposium on VLSI Technology Digest of Technical Papers*, May 18–21, 1987/Karuizawa, pp. 93–94.

Kakumu, et al., "PASPAC (Planarized Al/Silicide/Poly Si with Self Aligned Contact) with Low Contact Resistance and High Reliability in CMOS LSIs", 1987 *Symposium on VLSI Technology Digest of Technical Papers*, May 18–21, 1987/Karuizawa, pp. 77–78.

Kenny, et al., "A Buried–Plate Trench Cell for a 64–Mb DRAM", 1992 *Symposium on VLSI Technology Digest of Technical Papers*, Apr. 1992, pp. 14–15.

Subbanna, et al., "A Novel Borderless Contact/Interconnect Technology Using Aluminum Oxide Etch Stop for High Performance SRAM and Logic", Dec. 1993, pp. 441–444.

(List continued on next page.)

*Primary Examiner*—Kathleen Duda
*Attorney, Agent, or Firm*—Blakely, Sokoloff, Taylor & Zafman, LLP

[57] ABSTRACT

A lithographic patterning process uses multiple exposures to provide for relatively reduced pitch for features of a single patterned layer. A first imaging layer is exposed to radiation in accordance with a first pattern and developed. The resulting patterned layer is stabilized. A second imaging layer is subsequently formed to surround the first patterned layer, exposed to radiation in accordance with a second pattern, and developed to form a second patterned layer. As the first patterned layer has been stabilized, the first patterned layer remains with the second patterned layer to produce a single patterned layer. For another embodiment, a single imaging layer is patterned by exposure to radiation in accordance with two separate patterns. An exposed portion of the imaging layer is suitably stabilized to withstand subsequent lithographic process steps.

16 Claims, 10 Drawing Sheets

OTHER PUBLICATIONS

Kusters, et al., "A Stacked Capacitor Cell with a Fully Self-Aligned Contact Process for High-Density Dynamic Random Access Memories", *Journal of the Electrochemical Society*, vol. 139, No. 8, Aug. 1992, pp. 2318–2321.

"Method for Forming Via Hole Formation", *IBM Technical Disclosure Bulletin*, vol. 34, No. 10A, Mar. 1992, pp. 219–220.

"Self–Aligned, Borderless Polysilicon Contacts Using Polysilicon Pillars", *IBM Technical Disclosure Bulletin*, vol. 35, No. 2, Jul. 1992, pp. 480–483.

S. Wolf, Ph.D., et al., "Silicon Processing for the VLSI Era, vol. I: Process Technology", *Lithography I: Optical Resist Materials and Process Technology*, 1986, pp. 453–454.

S. Wolf, Ph.D., "Silicon Processing for the VLSI Era, vol. 2: Process Integration", *Multilevel–Interconnect Technology for VLSI & ULSI*, 1992, pp. 222–237.

"Method to Incorporate Three Sets of Pattern Information in Two Photomasking Steps," *IBM Technical Disclosure Bulletin*, vol. 32, No. 8A, pp. 218–219 (Jan. 1990).

"Dual–Image Resist for Single–Exposure Self–Aligned Processing," *IBM Technical Disclosure Bulletin*, vol. 33, No. 2, pp. 447–449 (Jul. 1990).

"Complementary Selective Writing by Direct–Write E–Beam/Optical Lithography Using Mixed Positive and Negative Resist," *IBM Technical Disclosure Bulletin*, vol. 33, No. 3A, pp. 62–63 (Aug. 1990).

"Sub–Micron Channel Length CMOS Technology," *IBM Technical Disclosure Bulletin*, vol. 33, No. 4, pp. 227–232 (Sep. 1990).

"Multilayer Circuit Fabrication Using Double Exposure of Positive Resist," *IBM Technical Disclosure Bulletin*, vol. 36, No. 10, pp. 423–424 (Oct. 1993).

Wolf, S., et al., *Silicon Processing for the VLSI Era, vol. 1: Process Technology*, Lattice Press, Sunset Beach, California, pp. 407–458 (1986).

METHOD FOR REDUCED PITCH LITHOGRAPHY

This is a continuation of application Ser. No. 08/361,595, filed Dec. 22, 1994, now abandoned.

BACKGROUND OF THE INVENTION

1. Field of the Invention

The present invention relates generally to the field of semiconductor fabrication. More particularly, the present invention relates to the field of lithography processing for semiconductor fabrication.

2. Description of the Related Art

Lithography processes are typically used for semiconductor fabrication, for example to form a mask over a layer to be patterned in accordance with various functional and/or design requirements for fabricating a desired semiconductor device.

For a typical lithography process, photoresist is deposited over the layer to be patterned and is exposed to ultraviolet radiation through a mask that defines the pattern to be formed in the photoresist. The photoresist is then developed to form a patterned photoresist layer over the underlying layer to be patterned. Those portions of the underlying layer that are not covered by photoresist may then be etched using suitable etch techniques and chemistries. The pattern in the photoresist is thus replicated in the underlying layer.

Typical lithography processes, however, limit the size and density with which semiconductor devices may be fabricated. For example, the minimum resolution capability of the lithography process determines the minimal pitch with which features for a patterned layer may be printed. The minimum lithographic resolution for a patterning process may depend, for example, on the lens used in exposing photoresist to radiation through the mask.

BRIEF SUMMARY AND OBJECTS OF THE INVENTION

One object of the present invention is to provide for a relatively reduced pitch for features of a patterned layer.

Another object of the present invention is to provide for the fabrication of relatively denser semiconductor devices.

Another object of the present invention is to provide for the fabrication of relatively smaller-sized semiconductor devices.

A lithography method for semiconductor fabrication using a semiconductor wafer is described. For the lithography method, a first imaging layer is formed over the semiconductor wafer. The first imaging layer is patterned in accordance with a first pattern to form a first patterned layer. The first patterned layer is stabilized. A second imaging layer is formed over the first patterned layer such that the first patterned layer is surrounded by the second imaging layer. The second imaging layer is patterned in accordance with a second pattern to form a second patterned layer.

Another lithography method for semiconductor fabrication using a semiconductor wafer is also described. For the lithography method, an imaging layer is formed over the semiconductor wafer. A portion of the imaging layer is exposed to radiation in accordance with a first pattern. The exposed portion of the imaging layer is stabilized. The imaging layer is patterned in accordance with a second pattern to form a patterned layer.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for method for reduced pitch lithography. In the following description, details are set forth such as specific materials, thicknesses, parameters, etc., in order to provide a thorough understanding of the present invention. It will be evident, however, that the present invention may be practiced without these details. In other instances, well-known process steps, equipment, etc., have not been described in particular detail so as not to obscure the present invention.

Figure 1:
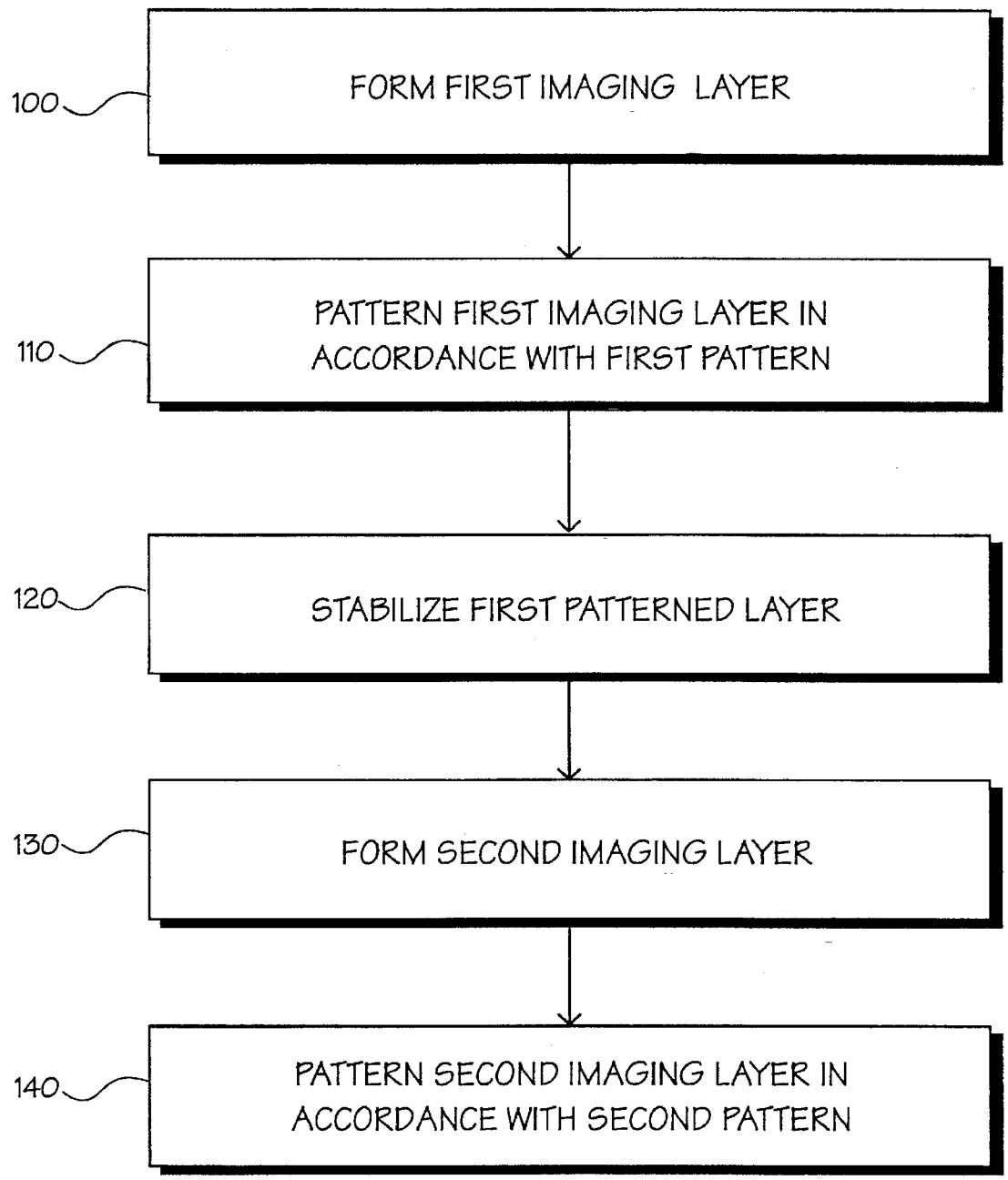
FIG. 1 illustrates, in flow diagram form, one lithography method for semiconductor fabrication.

FIG. 1 illustrates, in flow diagram form, one lithography method for semiconductor fabrication. For one embodiment, the method of FIG. 1 may be used for semiconductor fabrication using a semiconductor wafer, such as the semiconductor wafer illustrated in FIGS. 2, 3, 4, and 5 for example.

Figure 2:
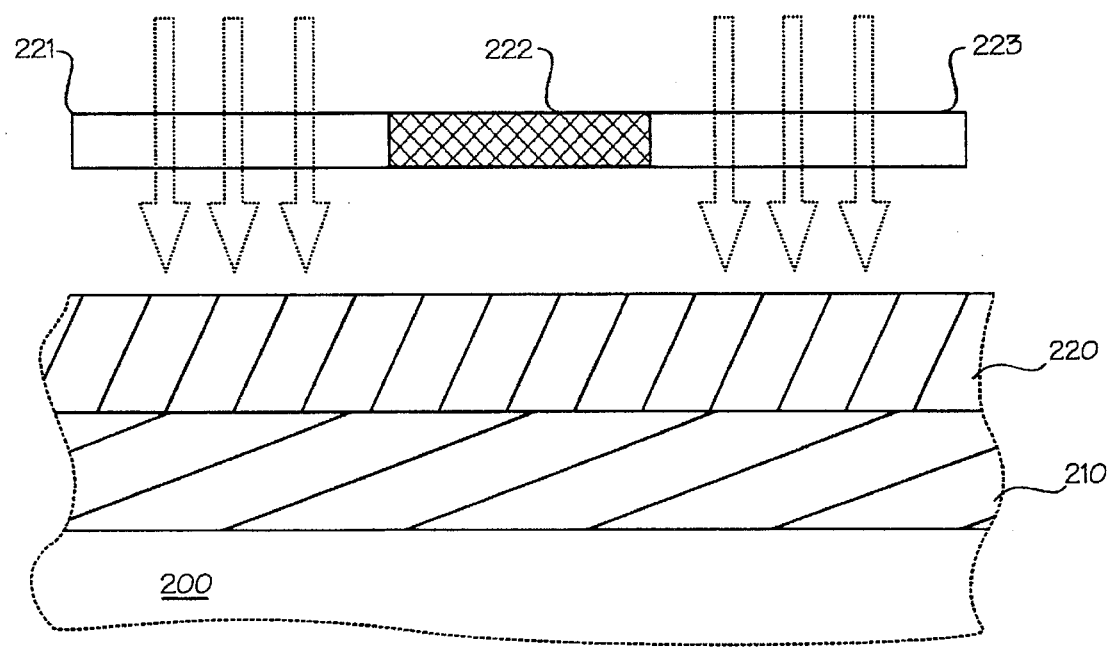
FIG. 2 illustrates a cross-sectional view of a semiconductor wafer having a first imaging layer being exposed to radiation through a first mask.

For the method of FIG. 1, a semiconductor substrate 200 is provided as illustrated in FIG. 2. Substrate 200 may include any suitable semiconductor material, including silicon (Si) for example.

As illustrated in FIG. 2, a layer 210 may be formed over substrate 200. Layer 210 may include any suitable material and may be formed to any suitable thickness using any suitable technique depending, for example, on the purpose of layer 210 in fabricating a desired semiconductor device. Layer 210 may include one or more layers, including device, dielectric, contact, interconnect, and/or via layers for example. Layer 210 is not necessary to practice the method of FIG. 1.

As one example, layer 210 may include a layer that is to be patterned in accordance with a subsequent mask layer formed over layer 210. Layer 210 may include a dielectric layer, including silicon dioxide ($SiO_2$) for example, that is to be patterned for a contact or interconnect layer, for example. Layer 210 may also include a layer over which a via or interconnect layer is to be formed. Layer 210 may have exposed regions to be electrically coupled by vias or interconnects formed in a subsequent layer.

For step 100 of FIG. 1, a first imaging layer is formed over the semiconductor wafer. As illustrated in FIG. 2, an imaging layer 220 is formed over layer 210. Imaging layer 220 may include any suitable material formed to any suitable thickness using any suitable technique.

For one embodiment, imaging layer 220 may include a suitable positive photoresist, for example, that has been spun-on to a thickness of approximately 10,000 Angstroms (Å). Other suitable thicknesses of positive photoresist, for example in the range of approximately 1,000 Å to approximately 30,000 Å, may also be used. For other embodiments, imaging layer 220 may include a suitable negative photoresist, a suitable radiation-sensitive polyimide, or other suitable radiation-sensitive materials for example. For this detailed description, the term radiation encompasses any energy radiated in the form of waves or particles. The term radiation may include ultraviolet (UV) light, x-ray radiation, electron beam or e-beam radiation, vacuum UV radiation, or ion beam radiation for example.

For step 110 of FIG. 1, the first imaging layer is patterned in accordance with a first pattern to form a first patterned layer. Any suitable lithographic patterning technique may be used and may depend, for example, on the material used for imaging layer 220.

Where a positive-tone imaging material is used for imaging layer 220, such as a suitable positive photoresist or a suitable positive-tone radiation-sensitive polyimide for example, imaging layer 220 may be exposed to radiation through a first mask having opaque feature 222 and clear features 221 and 223 as illustrated in FIG. 2. The first mask may include any suitable pattern of opaque and clear features that may depend, for example, on the desired pattern to be formed in imaging layer 220. For this detailed description, the term mask encompasses a reticle, for example, for use in a step-and-repeat projection system.

Imaging layer 220 may be exposed through the first mask using any suitable form of radiation. The radiation serves to render soluble in a suitable developer that portion of imaging layer 220 exposed to radiation through clear features 221 and 223. That portion of imaging layer 220 that has not been exposed to radiation remains relatively insoluble in the developer.

Figure 3:
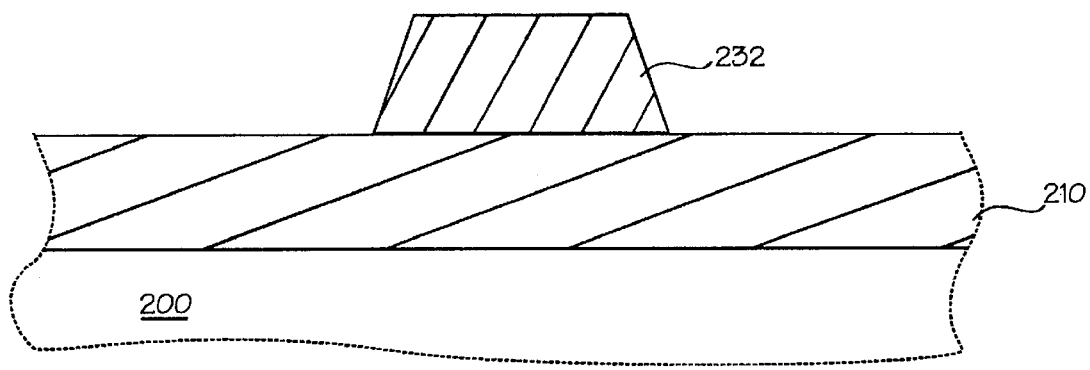
FIG. 3 illustrates a cross-sectional view of the semiconductor wafer of FIG. 2 after the first imaging layer has been developed.

Imaging layer 220 may then be developed in a suitable developer to form a first patterned layer 232. As illustrated in FIG. 3, that portion of imaging layer 220 exposed to radiation through the first mask is soluble in the developer and is thus dissolved from imaging layer 220. That portion of imaging layer 220 that has not been exposed to radiation is relatively insoluble in the developer, and thus remains to form first patterned layer 232.

For other embodiments where a suitable negative-tone imaging material is used for imaging layer 220, the negative-tone imaging layer 220 may be exposed to any suitable form of radiation through a suitable negative-tone mask having opaque features 221 and 223 and a clear feature 222, for example. Negative-tone imaging materials may include a suitable negative photoresist, a suitable positive photoresist that is to be subjected to an image reversal process, or a suitable negative-tone radiation-sensitive polyimide for example. The negative-tone imaging layer 220 may be developed in a suitable developer to form a first patterned layer 232 as illustrated in FIG. 3. That portion of imaging layer 220 exposed to radiation through the first mask is relatively insoluble in the developer and thus remains to form first patterned layer 232. That portion of imaging layer 220 that has not been exposed to radiation is soluble in the developer and is thus dissolved from imaging layer 220.

For step 120 of FIG. 1, the first patterned layer is stabilized. Any suitable stabilization technique may be used and may depend, for example, on the material used to form first patterned layer 232.

First patterned layer 232 may be stabilized to withstand subsequent lithographic processing steps. First patterned layer 232 may be stabilized to withstand chemical transformation as a result of any subsequent exposure to radiation, for example. First patterned layer 232 may also be stabilized to withstand dissolution by solvents during a subsequent spin-on of photoresist, for example. First patterned layer 232 may further be stabilized to withstand dissolution by a subsequent developer, for example.

Where a positive photoresist is used to form first patterned layer 232, a suitable deep ultraviolet (DUV) stabilization technique may be used to stabilize first patterned layer 232. For one embodiment, first patterned layer 232 may be irradiated with a DUV light source having a wavelength in the range of approximately 200 nanometers to approximately 400 nanometers, for example, and simultaneously heated with a temperature ramped up to approximately 230 degrees Celsius, for example, over an approximately 60 second period of time, for example. First patterned layer 232 may be irradiated at that peak temperature for approximately 5 seconds, for example. For other embodiments, first patterned layer 232 may be irradiated with a UV light source having other suitable wavelengths, for example in the range of approximately 100 nanometers to approximately 500 nanometers, and may be heated to other suitable peak temperatures, for example in the range of approximately 120 degrees Celsius to approximately 250 degrees Celsius. First patterned layer 232 may be irradiated at a peak temperature for any suitable length of time, for example in the range of approximately 2 seconds to approximately 60 seconds.

Where first patterned layer 232 includes a positive photoresist, first patterned layer 232 may be stabilized using other suitable techniques. As one example, a pirst technique may be used to form a carbon fluorine (CF$_4$) skin over first patterned layer 232 by exposing the photoresist to a fluorine ambient. A silylation technique may also be used to form a silicon dioxide (SiO$_2$) skin over first patterned layer 232. For other embodiments, other suitable techniques may be used to form a hardened skin over first patterned layer 232 to stabilize first patterned layer 232. For still other embodiments, the positive photoresist of first patterned layer 232 may be subjected to a suitable heat treatment or to a suitable radiation treatment to stabilize first patterned layer 232.

Stabilizing positive photoresist for first patterned layer 232 serves to neutralize photoactive compounds in the photoresist of first patterned layer 232. Upon any subsequent exposure to radiation then, first patterned layer 232 undergoes minimal, if any, chemical transformation. The photoresist of first patterned layer 232 may also be subjected to a subsequent spin-on of photoresist with relatively minimal, if any, dissolution by solvents of the subsequent photoresist layer. The photoresist of first patterned layer 232 may further be subjected to a subsequent development with relatively minimal, if any, dissolution by a developer.

For other embodiments where a negative photoresist is used to form first patterned layer 232, first patterned layer 232 may be stabilized while first patterned layer 232 is being patterned. Because first patterned layer 232 is formed from that portion of negative photoresist that has been exposed to radiation and rendered relatively insoluble in a developer, the negative photoresist of first patterned layer 232 is able to withstand chemical transformation from any subsequent exposure to radiation and is able to withstand dissolution by a subsequent developer. The photoresist of first patterned layer 232, however, may be subjected to a suitable stabilization technique as necessary to withstand dissolution by solvents during a subsequent spin-on of photoresist, for example. A suitable DUV stabilization technique, a suitable first technique, a suitable silylation technique, a suitable heat treatment, or a suitable radiation treatment, for example, may be used to stabilize the negative photoresist of first patterned layer 232.

For still other embodiments where a negative-tone radiation-sensitive polyimide is used to form first patterned layer 232, first patterned layer 232 may be stabilized while first patterned layer 232 is being patterned. Because first patterned layer 232 is formed from that portion of polyimide that has been exposed to radiation and rendered relatively insoluble in a developer, the polyimide of first patterned layer 232 is able to withstand chemical transformation from any subsequent exposure to radiation and is able to withstand dissolution by a subsequent developer. The polyimide of first patterned layer 232, however, may be subjected to a suitable stabilization technique, such as by heat treatment for final curing for example, as necessary to withstand dissolution by the formation of a subsequent layer over first patterned layer 232, for example.

Figure 4:
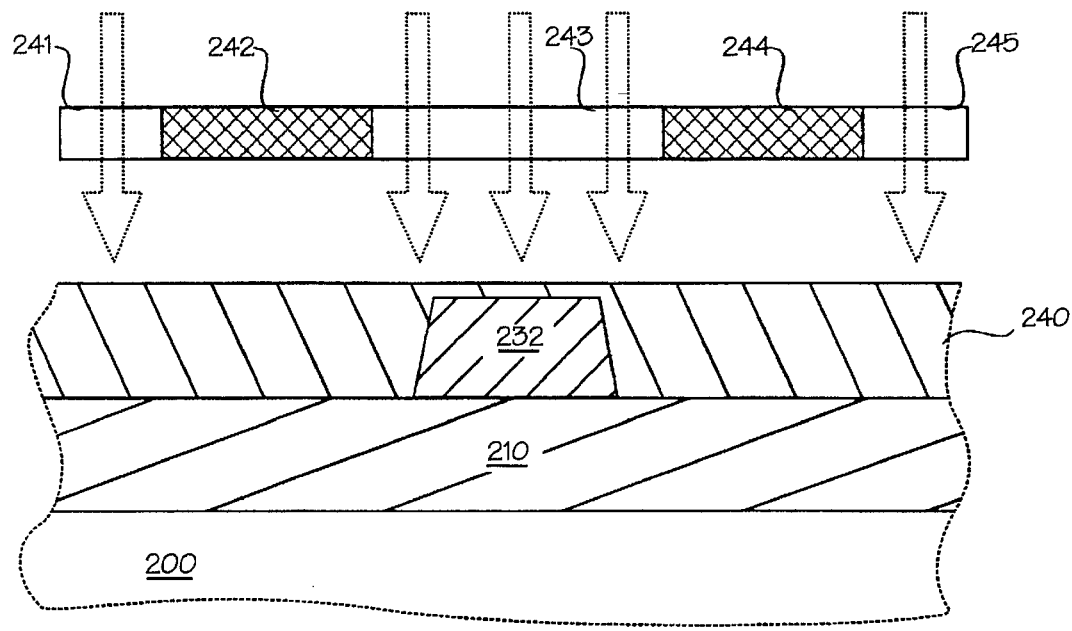
FIG. 4 illustrates a cross-sectional view of the semiconductor wafer of FIG. 3 where a second imaging layer is formed over the wafer and is being exposed to radiation through a second mask.

For step 130 of FIG. 1, a second imaging layer is formed over the semiconductor wafer. As illustrated in FIG. 4, an imaging layer 240 is formed over first patterned layer 232 and over layer 210. Imaging layer 240 is formed to surround first patterned layer 232 on the sidewalls of first patterned layer 232. Imaging layer 240 may optionally be formed to cover the top of first patterned layer 232 as well. Imaging layer 240 may include any suitable material formed to any suitable thickness using any suitable technique.

For one embodiment, imaging layer 240 may include a suitable positive photoresist, for example, that has been spun-on to a thickness of approximately 10,000 Å. Other suitable thicknesses of positive photoresist, for example thicknesses approximately equal to or greater than that of first patterned layer 232, may also be used. Imaging layer 240 may include other suitable materials, including a suitable negative photoresist, a suitable radiation-sensitive polyimide, or other suitable radiation-sensitive materials for example. For embodiments where photoresist is spun-on to form imaging layer 240, first patterned layer 232 has preferably been stabilized to withstand dissolution by solvents during spin-on of the photoresist for imaging layer 240.

For step 140 of FIG. 1, the second imaging layer is patterned in accordance with a second pattern to form a second patterned layer. Any suitable lithographic patterning technique may be used and may depend, for example, on the material used for imaging layer 240.

Where a positive-tone imaging material is used for imaging layer 240, such as a suitable positive photoresist or a suitable positive-tone radiation-sensitive polyimide for example, imaging layer 240 may be exposed to radiation through a second mask having opaque features 242 and 244 and clear features 241, 243, and 245 as illustrated in FIG. 4. The second mask may include any suitable pattern of opaque and clear features that may depend, for example, on the desired pattern to be formed in imaging layer 240.

Imaging layer 240 may be exposed through the second mask using any suitable form of radiation. The radiation serves to render soluble in a suitable developer that portion of imaging layer 240 exposed to radiation through clear features 241, 243, and 245. That portion of imaging layer 240 that has not been exposed to radiation remains relatively insoluble in the developer. As first patterned layer 232 has been stabilized, first patterned layer 232 undergoes minimal, if any, chemical transformation as a result of any exposure to radiation for patterning imaging layer 240.

Preferably, first patterned layer 232 does not affect in a material manner the lithographic patterning of imaging layer 240. That is, first patterned layer 232 preferably does not materially affect the desired patterning of imaging layer 240, for example, by reflecting any radiation. First patterned layer 232 may be treated using any suitable processing technique, such as bleaching or baking for example, as necessary to avoid or minimize adverse effects by first patterned layer 232 in patterning imaging layer 240. For one embodiment, the material used for first patterned layer 232 may match or substantially match the optical and mass properties, for example, of the material used for imaging layer 240 so as avoid or minimize any reflection of radiation in patterning imaging layer 240.

Figure 5:
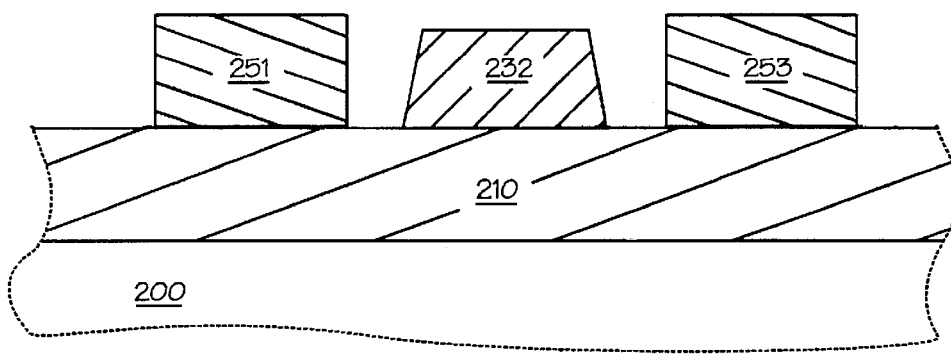
FIG. 5 illustrates a cross-sectional view of the semiconductor wafer of FIG. 4 after the second imaging layer has been developed.

Imaging layer 240 may then be developed in a suitable developer to form a second patterned layer that includes features 251 and 253. As illustrated in FIG. 5, that portion of imaging layer 240 exposed to radiation through the second mask is soluble in the developer and is thus dissolved from imaging layer 240. That portion of imaging layer 240 that has not been exposed to radiation is relatively insoluble in the developer, and thus remains to form features 251 and 253 for the second patterned layer. As first patterned layer 232 has been stabilized, first patterned layer 232 is relatively insoluble in developer and thus undergoes relatively minimal, if any, dissolution for the development of imaging layer 240.

For other embodiments where a suitable negative-tone imaging material is used for imaging layer 240, the negative-tone imaging layer 240 may be exposed to any suitable form of radiation through a suitable negative-tone mask having opaque features 241, 243, and 245 and clear features 242 and 244, for example. Negative-tone imaging materials may include a suitable negative photoresist, a suitable positive photoresist that is to be subjected to an image reversal process, or a suitable negative-tone radiation-sensitive polyimide for example. The negative-tone imaging layer 240 may be developed in a suitable developer to form features 251 and 253 for the second patterned layer as illustrated in FIG. 5. That portion of imaging layer 240 exposed to radiation through the second mask is relatively insoluble in the developer and thus remains to form features 251 and 253. That portion of imaging layer 240 that has not been exposed to radiation is soluble in the developer and is thus dissolved from imaging layer 240.

For one embodiment for the method of FIG. 1, a suitable positive photoresist may be used for both imaging layers 220 and 240 while a suitable deep ultraviolet (DUV) stabilization technique may be used to stabilize the positive photoresist for first patterned layer 232. For another embodiment, a suitable negative photoresist may be used for both imaging layers 220 and 240.

For a further embodiment for the method of FIG. 1, imaging layer 220 may include a suitable positive photoresist and may be exposed through a suitable negative-tone mask. Imaging layer 220 may then be subjected to a suitable image reversal process to form first patterned layer 232. The image reversal process preferably serves to stabilize first patterned layer 232. The photoresist of first patterned layer 232, however, may be subjected to a suitable stabilization technique such as a suitable DUV stabilization technique for example, as necessary to withstand dissolution by solvents during a subsequent spin-on of photoresist. Imaging layer 240 for this embodiment may include any suitable material and may be patterned using any suitable lithographic patterning technique to form the second patterned layer.

As a result of the method of FIG. 1, a single patterned layer is formed over layer 210 as illustrated in FIG. 5. This single patterned layer is formed from the patterning of imaging layer 220 and the subsequent patterning of imaging layer 240.

Figure 6:
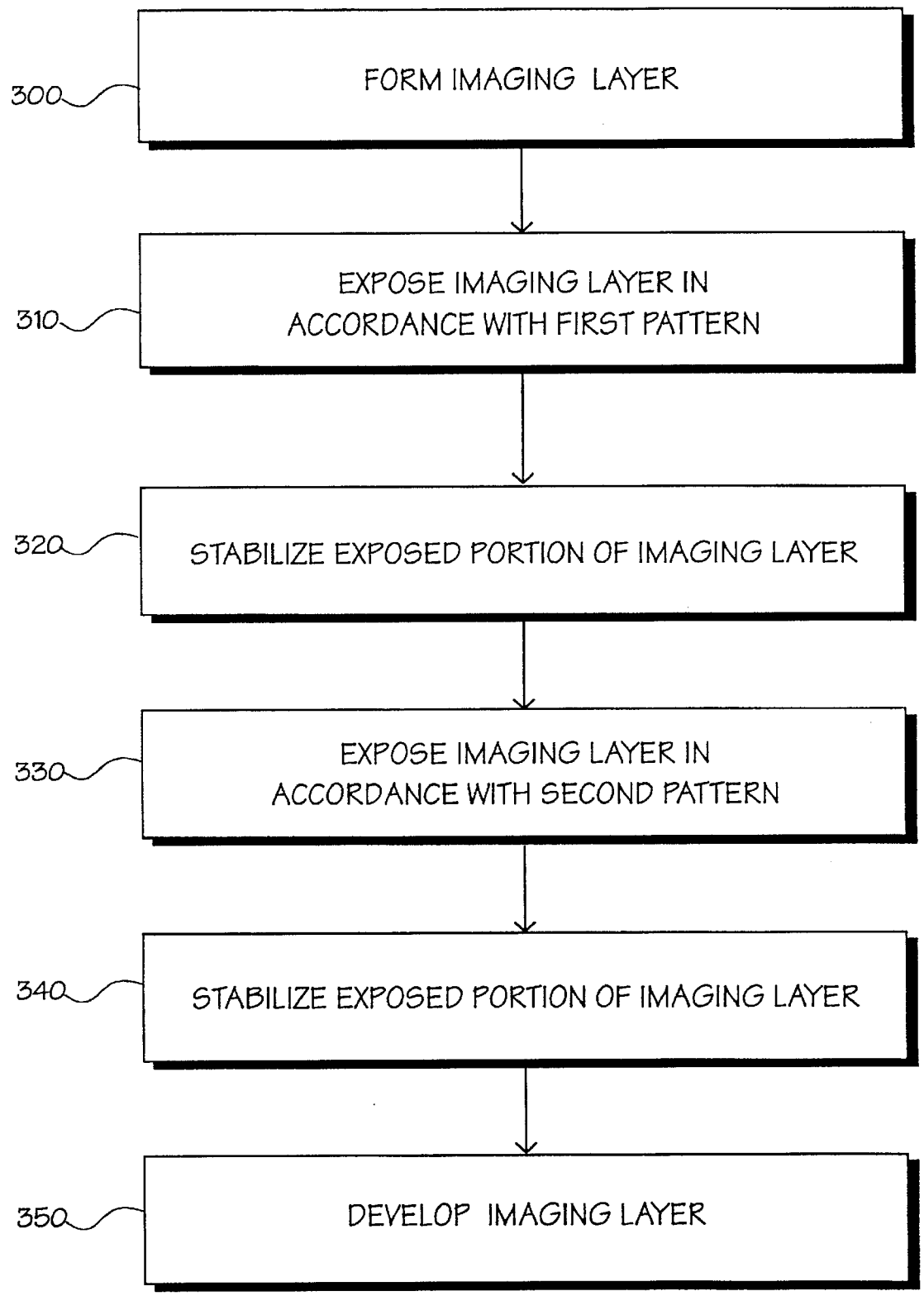
FIG. 6 illustrates, in flow diagram form, another lithography method for semiconductor fabrication.

FIG. 6 illustrates, in flow diagram form, another lithography method for semiconductor fabrication. For one embodiment, the method of FIG. 6 may be used for semiconductor fabrication using a semiconductor wafer, such as the semiconductor wafer illustrated in FIGS. 7, 8, 9, 10, and 11 for example.

Figure 7:
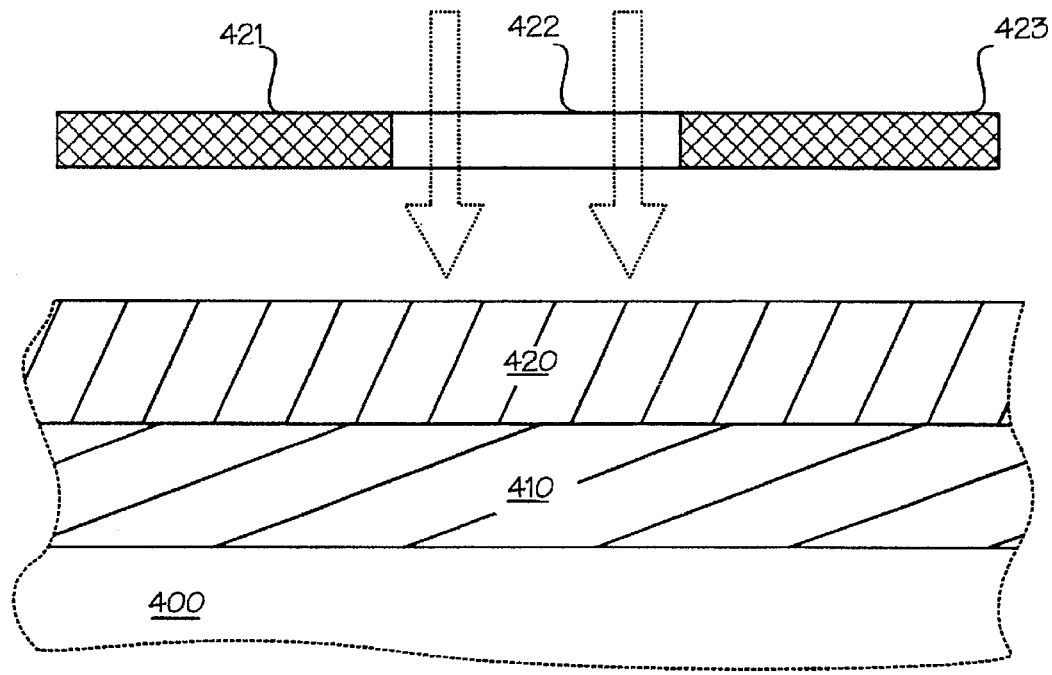
FIG. 7 illustrates a cross-sectional view of a semiconductor wafer having an imaging layer being exposed to radiation through a first mask.

For the method of a FIG. 6, a semiconductor substrate 400 is provided as illustrated in FIG. 7. Substrate 400 may include any suitable semiconductor material, including silicon (Si) for example.

As illustrated in FIG. 7, a layer 410 may be formed over substrate 400. Layer 410 may include any suitable material and may be formed to any suitable thickness using any suitable technique depending, for example, on the purpose of layer 410 in fabricating a desired semiconductor device. The above discussion pertaining to layer 210 for the method of FIG. 1 also pertains to layer 410 for the method of FIG. 6.

For step 300 of FIG. 6, an imaging layer is formed over the semiconductor wafer. As illustrated in FIG. 7, an imaging layer 420 is formed over layer 410. Imaging layer 420 may include any suitable material formed to any suitable thickness using any suitable technique.

For one embodiment, imaging layer 420 may include a suitable positive photoresist, for example, that has been spun-on to a thickness of approximately 10,000 Å. Other suitable thicknesses of positive photoresist, for example in the range of approximately 1,000 Å to approximately 30,000 Å, may also be used. For other embodiments, imaging layer 420 may include other suitable radiation-sensitive materials.

For step 310 of FIG. 6, the imaging layer is exposed to radiation in accordance with a first pattern. Imaging layer 420 may be exposed in accordance with any suitable pattern using any suitable form of radiation.

Imaging layer 420 may be exposed to radiation through a first mask having opaque features 421 and 423 and clear feature 422 as illustrated in FIG. 7. The first mask may include any suitable pattern of opaque and clear features that may depend, for example, on the desired pattern to be formed in imaging layer 420. Where a positive photoresist is used for imaging layer 420 and is to be subjected to an image reversal process, the first mask may be a suitable negative-tone mask to form the desired pattern in imaging layer 420.

Figure 8:
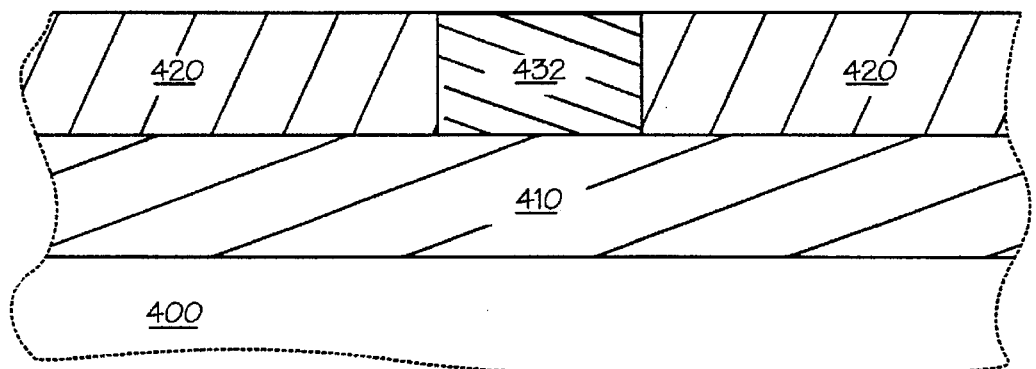
FIG. 8 illustrates a cross-sectional view of the semiconductor wafer of FIG. 7 after an exposed portion of the imaging layer has been stabilized.

For step 320 of FIG. 6, that portion of the imaging layer exposed to radiation is stabilized. Any suitable stabilization technique may be used and may depend, for example, on the material used to form imaging layer 420. As illustrated in FIG. 8, an exposed portion 432 of imaging layer 420 has been stabilized.

Exposed portion 432 of imaging layer 420 may be stabilized to withstand subsequent lithographic processing steps. Exposed portion 432 may be stabilized to withstand chemical transformation as a result of any subsequent exposure to radiation, for example. Exposed portion 432 may also be stabilized to withstand dissolution by a subsequent developer, for example.

Where a suitable positive photoresist is used to form imaging layer 420, a suitable image reversal process may be used to stabilize exposed portion 432 of imaging layer 420. For one embodiment, imaging layer 420 may be, after the exposure to radiation through the first mask, subjected to an ammonia ($NH_3$) ambient and heated to a temperature of approximately 95 degrees Celsius, for example, in an approximately 600 torr environment, for example, for approximately 45 minutes, for example. Other suitable temperatures, pressures, and periods of time may also be used. Temperatures may range from approximately 80 degrees Celsius to approximately 110 degrees Celsius, for example. Pressures may range from approximately 500 torr to approximately 760 torr, for example. Time periods may range from approximately 30 minutes to approximately 60 minutes, for example.

For other embodiments, a suitable positive photoresist may be used for imaging layer 420 such that heating imaging layer 420 invokes the image reversal process to stabilize exposed portion 432.

Stabilizing positive photoresist in exposed portion 432 serves to neutralize photoactive compounds in exposed portion 432. Upon any exposure to radiation then, exposed portion 432 undergoes minimal, if any, chemical transformation. Exposed portion 432 may also be subjected to a subsequent development with relatively minimal, if any, dissolution by a developer.

For step 330 of FIG. 6, the imaging layer is exposed to radiation in accordance with a second pattern. Imaging layer 420 may be exposed in accordance with any suitable pattern using any suitable form of radiation.

Figure 9:
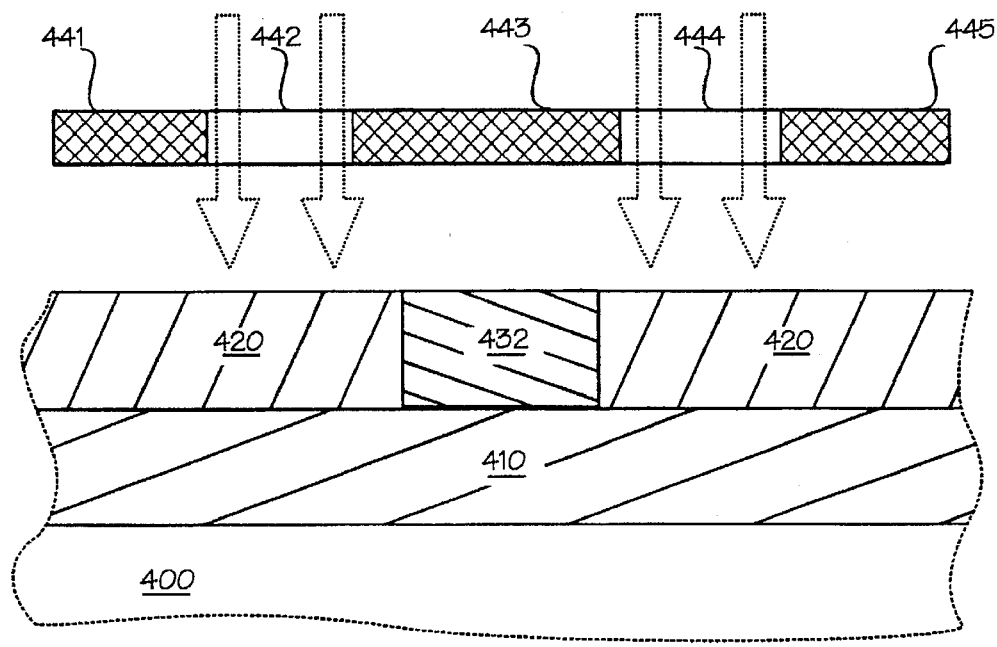
FIG. 9 illustrates a cross-sectional view of the semiconductor wafer of FIG. 8 where the imaging layer is exposed to radiation through a second mask.

Imaging layer 420 may be exposed to radiation through a second mask having opaque features 441, 443, and 445 and clear features 442 and 444 as illustrated in FIG. 9. The second mask may include any suitable pattern of opaque and clear features that may depend, for example, on the desired pattern to be formed in imaging layer 420. Where a positive photoresist is used for imaging layer 420 and is to be subjected to an image reversal process, the second mask may be a suitable negative-tone mask to form the desired pattern in imaging layer 420.

Figure 10:
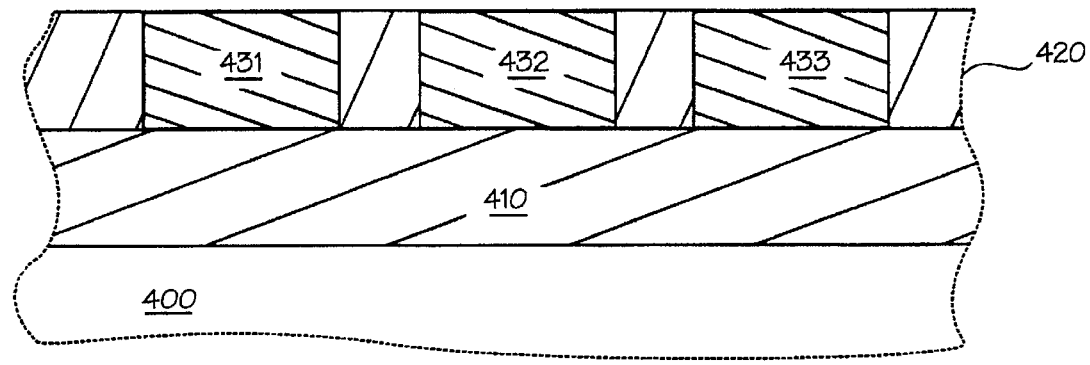
FIG. 10 illustrates a cross-sectional view of the semiconductor wafer of FIG. 9 after an exposed portion of the imaging layer has been stabilized.

For step 340 of FIG. 6, that portion of the imaging layer exposed to radiation for step 330 is stabilized. Any suitable stabilization technique may be used and may depend, for example, on the material used to form imaging layer 420. As illustrated in FIG. 10, an exposed portion 431 and 433 of imaging layer 420 has been stabilized.

Exposed portion 431 and 433 of imaging layer 420 may be stabilized to withstand subsequent lithographic processing steps. Exposed portion 431 and 433 may be stabilized to withstand chemical transformation as a result of any subsequent exposure to radiation, for example. Exposed portion 431 and 433 may also be stabilized to withstand dissolution by a subsequent developer, for example.

Where a suitable positive photoresist is used to form imaging layer 420, a suitable image reversal process may be used to stabilize exposed portion 431 and 433 of imaging layer 420. For one embodiment, imaging layer 420 may be subjected to an image reversal process similar to the image reversal process used to stabilize exposed portion 432. The above discussion regarding the image reversal process for exposed portion 432 similarly applies for stabilizing exposed portion 431 and 433.

Stabilizing the positive photoresist in exposed portion 431 and 433 serves to neutralize photoactive compounds in exposed portion 431 and 433. Upon any exposure to radiation then, exposed portion 431 and 433 undergoes minimal, if any, chemical transformation. Exposed portion 431 and 433 may also be subjected to a subsequent development with relatively minimal, if any, dissolution by a developer.

Where positive photoresist has been subjected to an image reversal process to render exposed portions 431, 432, and 433 relatively insoluble, imaging layer 420 may be subjected to a flood exposure of radiation to render the remaining portion of imaging layer 420 soluble for development. This remaining portion of imaging layer 420 has not been previously exposed to radiation through the first or second masks. Imaging layer 420 may be flood exposed using any suitable form of radiation. For one embodiment, the positive photoresist of imaging layer 420 may be subjected to approximately 600 millijoules of a collimated light beam approximately 365 nanometers in wavelength for this flood exposure. As portions 431, 432, and 433 of imaging layer 420 have been stabilized, portions 431, 432, and 433 undergo minimal, if any, chemical transformation as a result of any exposure to radiation for patterning imaging layer 420.

Figure 11:
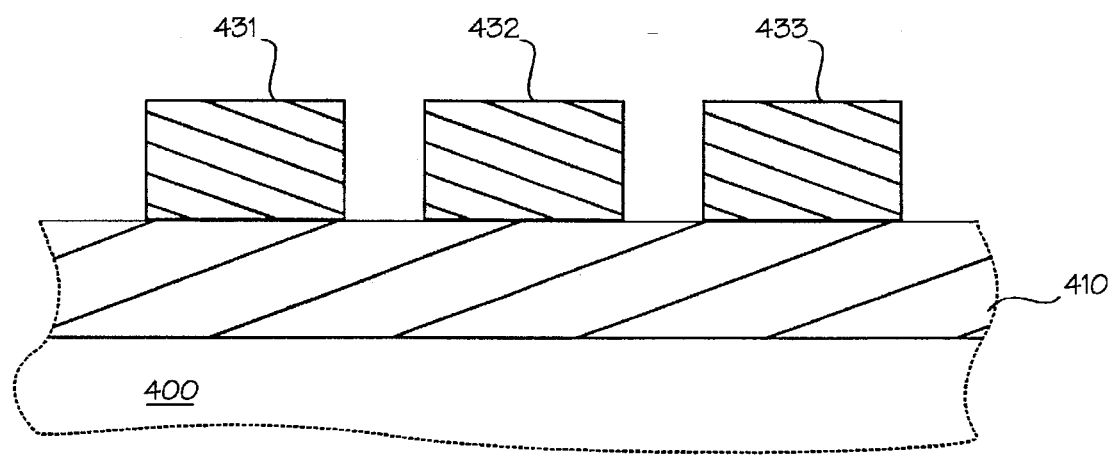
FIG. 11 illustrates a cross-sectional view of the semiconductor wafer of FIG. 10 after the imaging layer has been developed.

For step 350 of FIG. 6, the imaging layer is developed to form a patterned layer. Imaging layer 420 may be developed in any suitable developer to form a patterned layer that includes portions 431, 432, and 433 as illustrated in FIG. 11. As portions 431, 432, and 433 of imaging layer 420 have been stabilized, portions 431, 432, and 433 are relatively insoluble in developer and thus undergo relatively minimal, if any, dissolution. Portions 431, 432, and 433 thus remain to form features 431, 432, and 433 for the patterned layer after development. The remaining portion of imaging layer 420 is dissolved from imaging layer 420 in the developer.

As a result of the method of FIG. 6, a single patterned layer is formed over layer 410 as illustrated in FIG. 11.

For another embodiment for the method of FIG. 6, a suitable negative-tone radiation-sensitive polyimide may be used to form imaging layer 420 for step 300 of FIG. 6. For step 310 of FIG. 6, imaging layer 420 may be exposed to radiation through a first suitable negative-tone mask as illustrated in FIG. 7. The exposure of the polyimide to radiation for step 310 of FIG. 6 serves to stabilize exposed portion 432 for step 320 of FIG. 6, as illustrated in FIG. 8. Upon any subsequent exposure to radiation, exposed portion 432 undergoes minimal, if any, chemical transformation. Exposed portion 432 may also be subjected to a subsequent development with relatively minimal, if any, dissolution by a developer.

For step 330 of FIG. 6, imaging layer 420 may be exposed to radiation through a second suitable negative-tone mask, as illustrated in FIG. 9. The exposure of the polyimide to radiation for step 330 of FIG. 6 serves to stabilize exposed portion 431 and 433 for step 340 of FIG. 6, as illustrated in FIG. 10. Exposed portion 431 and 433 may be subjected to a subsequent development with relatively minimal, if any, dissolution by a developer.

For step 350 of FIG. 6, the polyimide of imaging layer 420 may be developed in any suitable developer to form a patterned layer that includes portions 431, 432, and 433 as illustrated in FIG. 11. The resulting single patterned layer may then be finally cured using a suitable heat treatment.

Figure 12:
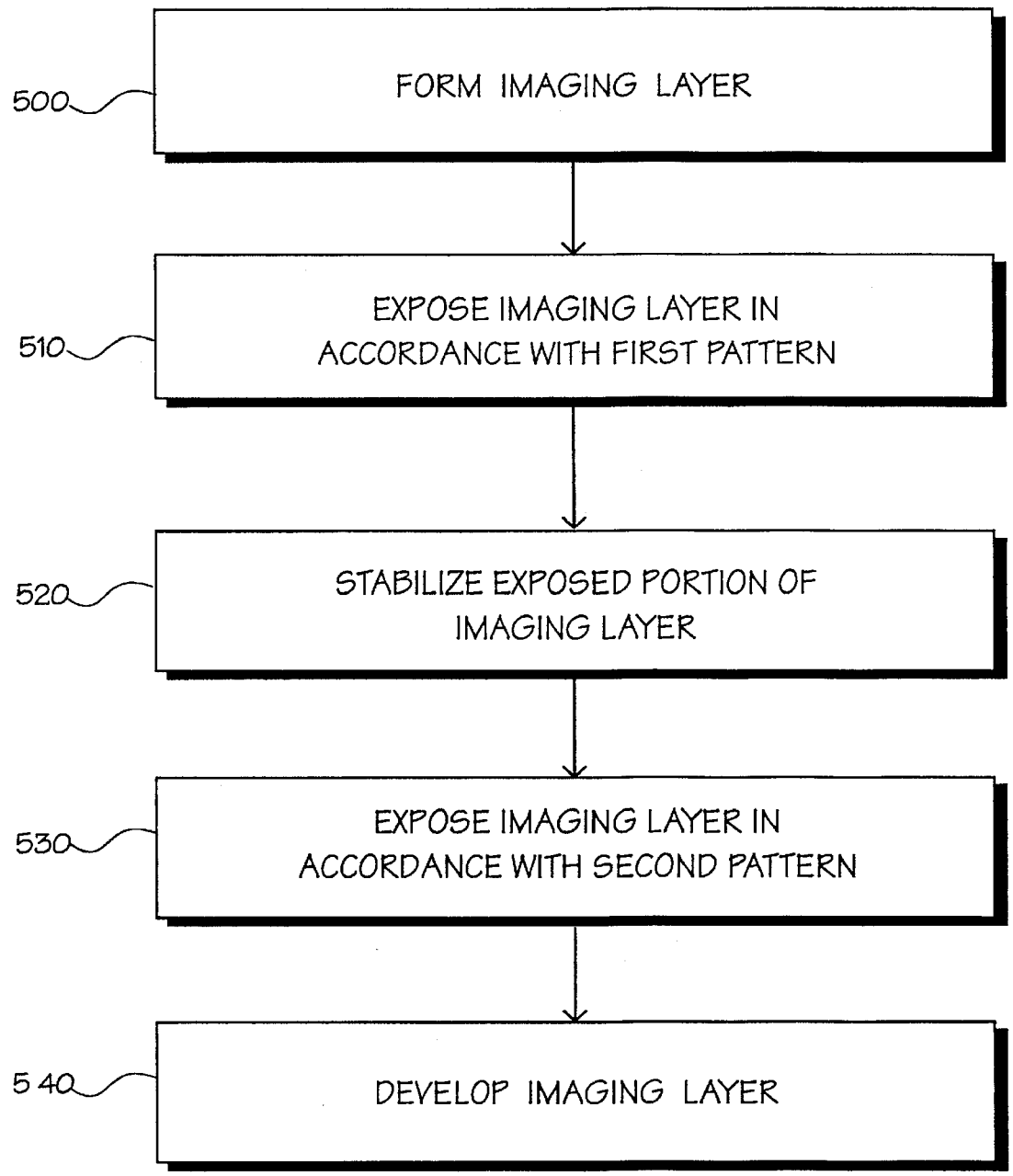
FIG. 12 illustrates, in flow diagram form, another lithography method for semiconductor fabrication.

FIG. 12 illustrates, in flow diagram form, another lithography method for semiconductor fabrication. For one embodiment, the method of FIG. 12 may be used for semiconductor fabrication using a semiconductor wafer, such as the semiconductor wafer illustrated in FIGS. 13, 14, 15, and 16 for example.

Figure 13:
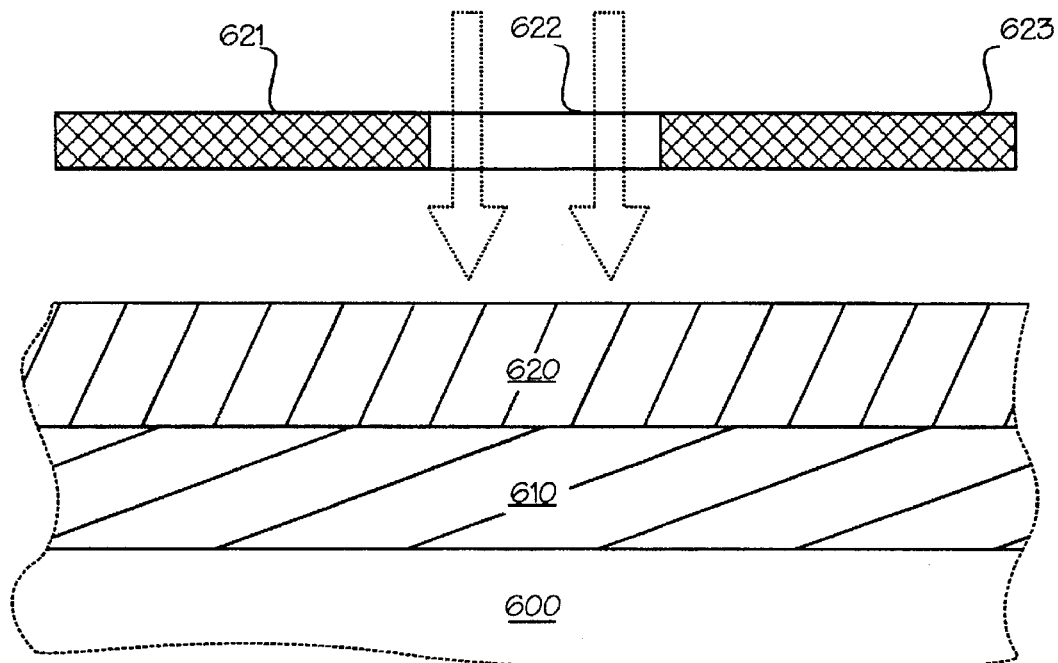
FIG. 13 illustrates a cross-sectional view of a semiconductor wafer having an imaging layer being exposed to radiation through a first mask.

For the method of a FIG. 12, a semiconductor substrate 600 is provided as illustrated in FIG. 13. Substrate 600 may include any suitable semiconductor material, including silicon (Si) for example.

As illustrated in FIG. 13, a layer 610 may be formed over substrate 600. Layer 610 may include any suitable material and may be formed to any suitable thickness using any suitable technique depending, for example, on the purpose of layer 610 in fabricating a desired semiconductor device. The above discussion pertaining to layer 210 for the method of FIG. 1 also pertains to layer 610 for the method of FIG. 12.

For step 500 of FIG. 12, an imaging layer is formed over the semiconductor wafer. As illustrated in FIG. 13, an imaging layer 620 is formed over layer 610. Imaging layer 620 may include any suitable material formed to any suitable thickness using any suitable technique.

For one embodiment, imaging layer 620 may include a suitable positive photoresist, for example, that has been spun-on to a thickness of approximately 10,000 Å. Other suitable thicknesses of positive photoresist, for example in the range of approximately 1,000 Å to approximately 30,000 Å, may also be used.

For step 510 of FIG. 12, the imaging layer is exposed to radiation in accordance with a first pattern. Imaging layer 620 may be exposed in accordance with any suitable pattern using any suitable form of radiation.

Where a positive photoresist is used for imaging layer 620, imaging layer 620 may be exposed to radiation through a first mask having opaque features 621 and 623 and clear feature 622 as illustrated in FIG. 13. The first mask may include any suitable pattern of opaque and clear features that may depend, for example, on the desired pattern to be formed in imaging layer 620. Where a positive photoresist is used for imaging layer 620 and is to be subjected to an image reversal process, the first mask may be a suitable negative-tone mask to form the desired pattern in imaging layer 620.

Figure 14:
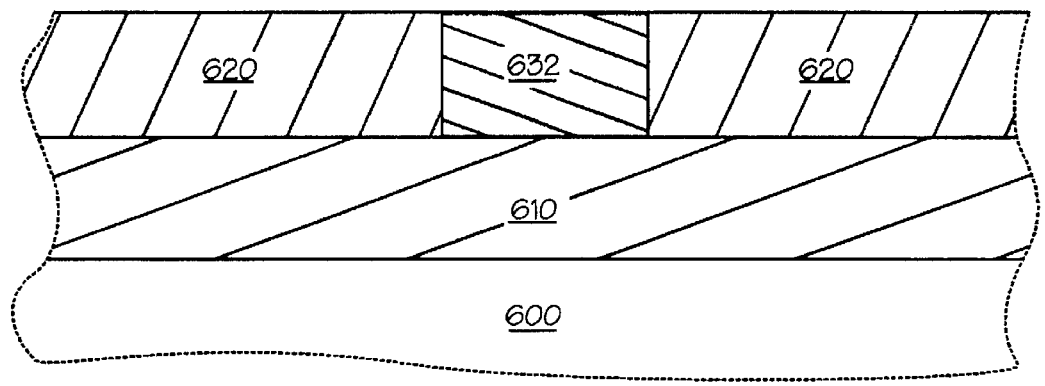
FIG. 14 illustrates a cross-sectional view of the semiconductor wafer of FIG. 13 after an exposed portion of the imaging layer has been stabilized.

For step 520 of FIG. 12, that portion of the imaging layer exposed to radiation is stabilized. Any suitable stabilization technique may be used and may depend, for example, on the material used to form imaging layer 620. As illustrated in FIG. 14, an exposed portion 632 of imaging layer 620 has been stabilized.

Exposed portion 632 of imaging layer 620 may be stabilized to withstand subsequent lithographic processing steps. Exposed portion 632 may be stabilized to withstand chemical transformation as a result of any subsequent exposure to radiation, for example. Exposed portion 632 may also be stabilized to withstand dissolution by a subsequent developer, for example.

Where a suitable positive photoresist is used to form imaging layer 620, a suitable image reversal process may be used to stabilize exposed portion 632 of imaging layer 620. For one embodiment, imaging layer 620 may be, after the exposure to radiation through the first mask, subjected to an ammonia ($NH_3$) ambient and heated to a temperature of approximately 95 degrees Celsius, for example, in an approximately 600 torr environment, for example, for approximately 45 minutes, for example. Other suitable temperatures, pressures, and periods of time may also be used. Temperatures may range from approximately 80 degrees Celsius to approximately 110 degrees Celsius, for example. Pressures may range from approximately 500 torr to approximately 760 torr, for example. Time periods may range from approximately 30 minutes to approximately 60 minutes, for example.

For other embodiments, a suitable positive photoresist may be used for imaging layer 620 such that heating imaging layer 620 invokes the image reversal process to stabilize exposed portion 632.

Stabilizing positive photoresist in exposed portion 632 serves to neutralize photoactive compounds in exposed portion 632. Upon any exposure to radiation then, exposed portion 632 undergoes minimal, if any, chemical transformation. Exposed portion 632 may also be subjected to a subsequent development with relatively minimal, if any, dissolution by a developer.

Figure 15:
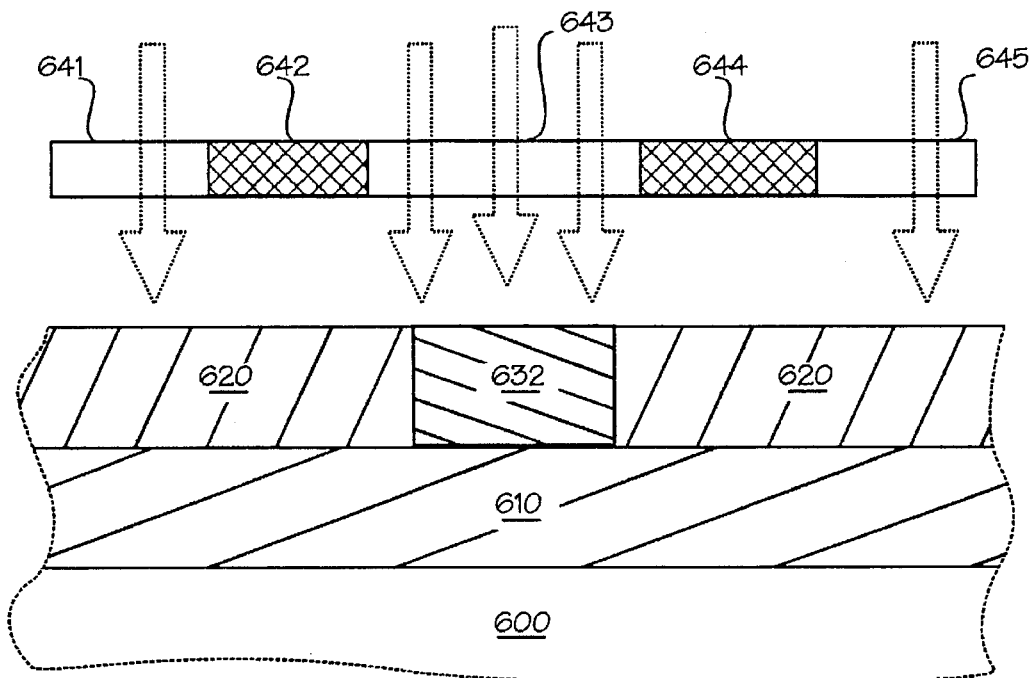
FIG. 15 illustrates a cross-sectional view of the semiconductor wafer of FIG. 14 where the imaging layer is exposed to radiation through a second mask.

For step 530 of FIG. 12, the imaging layer is exposed to radiation in accordance with a second pattern. Imaging layer 620 may be exposed in accordance with any suitable pattern using any suitable form of radiation.

Where a positive photoresist is used for imaging layer 620, imaging layer 620 may be exposed to radiation through a second mask having opaque features 642 and 644 and clear features 641, 643, and 645 as illustrated in FIG. 15. The second mask may include any suitable pattern of opaque and clear features that may depend, for example, on the desired pattern to be formed in imaging layer 620.

Imaging layer 620 may be exposed through the second mask using any suitable form of radiation. The radiation serves to render soluble in a suitable developer that portion of imaging layer 620 exposed to radiation through clear features 641, 643, and 645. As portion 632 of imaging layer 620 has been stabilized, portion 632 undergoes minimal, if any, chemical transformation as a result of any exposure to radiation for patterning imaging layer 620. Portion 632 thus remains relatively insoluble despite any exposure to radiation. That portion of imaging layer 620 that has not been exposed to radiation remains relatively insoluble in the developer.

Preferably, portion 632 of imaging layer 620 does not affect in a material manner the subsequent lithographic patterning of imaging layer 620. That is, portion 632 preferably does not materially affect the desired subsequent patterning of imaging layer 620, for example, by reflecting any radiation.

Figure 16:
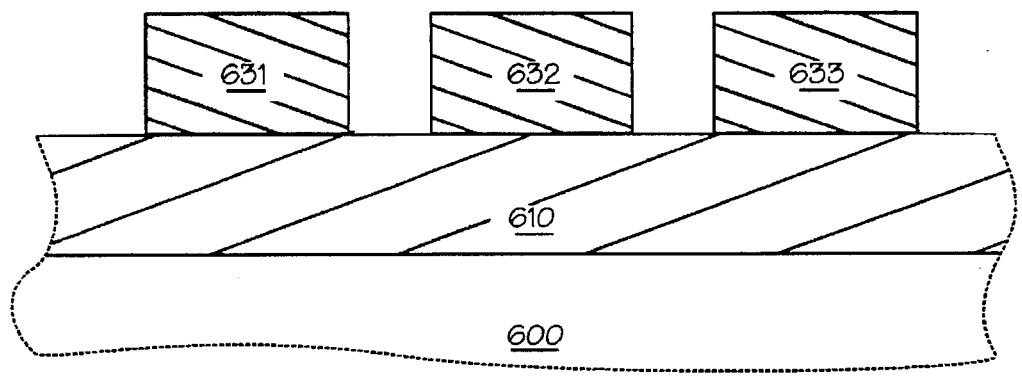
FIG. 16 illustrates a cross-sectional view of the semiconductor wafer of FIG. 15 after the imaging layer has been developed.

For step 540 of FIG. 12, the imaging layer is developed to form a patterned layer. Imaging layer 620 may be developed in any suitable developer to form a patterned layer that includes features 631, 632, and 633 as illustrated in FIG. 16. That portion of imaging layer 620 exposed to radiation through the second mask is soluble in the developer and is thus dissolved from imaging layer 620. As portion 632 of imaging layer 620 has been stabilized, portion 632 is relatively insoluble in developer and thus undergoes relatively minimal, if any, dissolution for the development of imaging layer 620. That portion of imaging layer 620 that has not been exposed to radiation is also relatively insoluble in the developer, and thus remains to form features 631 and 633 for the patterned layer.

As a result of the method of FIG. 12, a single patterned layer is formed over layer 610 as illustrated in FIG. 16.

Although the methods of FIGS. 1, 6, and 12 are illustrated as using masks for the selective exposure of imaging layers to radiation, other suitable lithographic techniques may also be used for the methods of FIGS. 1, 6, and 12 to expose imaging layers to radiation in accordance with suitable patterns. As one example, a suitable direct-write exposure technique may be used to expose an imaging layer to radiation in accordance with a suitable pattern.

For the methods of FIGS. 1, 6, and 12, features for the resulting single patterned layer, such as the patterned layer illustrated in FIGS. 5, 11, and 16 respectively, may be formed relatively closer to one another as the resolution of the lens for the lithographic patterning of an imaging layer through a single exposure to radiation does not limit the pitch for adjacent features of the single patterned layer. As these features may be formed relatively closer to one another, the density with which semiconductor devices may be fabricated may be increased, allowing semiconductor devices to be fabricated with relatively smaller sizes.

The lithography methods of FIG. 1, 6, and 12 may be used, for example, in fabricating various semiconductor devices, including digital components such as microprocessors, memories such as random access memories (RAMs), controllers, etc.

The lithography methods of FIGS. 1, 6, and 12 may be used, for example, to form a single patterned layer that serves as a mask in patterning an underlying layer, such as layers 210, 410, and 610 respectively. The underlying layer may be patterned using a suitable etch technique and chemistry. As the pattern in the mask layer, such as the single patterned layer illustrated in FIGS. 5, 11, and 16, becomes replicated in the underlying layer, features for the underlying layer may be formed relatively closer to one another.

As another example, the lithography methods of FIGS. 1, 6, and 12 may be used to form disposable posts as discussed in U.S. application Ser. No. 08/179,615, filed Jan. 10, 1994, entitled DISPOSABLE POST PROCESSING FOR SEMICONDUCTOR DEVICE FABRICATION, by James M. Cleeves, and assigned to the same assignee as the present application. As disposable posts are removed to form openings for a subsequent layer, such as a contact, via, or interconnect layer for example, such openings may be formed relatively closer to one another.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A lithography method for semiconductor fabrication using a semiconductor wafer, comprising the steps of:
   (a) forming a first imaging layer over the semiconductor wafer;
   (b) patterning the first imaging layer in accordance with a first pattern to form a first patterned layer having a first feature;
   (c) stabilizing the first patterned layer;
   (d) forming a second imaging layer over the first pattern layer; and
   (e) patterning the second imaging layer in accordance with a second pattern to form a second patterned layer having a second feature distinct from the first feature, wherein the second patterned layer and the first patterned layer form a single patterned layer, and wherein the first and second features which are formed relatively closer to one another than is possible through a single exposure to radiation.

2. The method of claim 1, wherein the first imaging layer includes a positive photoresist.

3. The method of claim 1, wherein the second imaging layer includes a positive photoresist.

4. The method of claim 1, wherein the patterning step (b) includes the steps of:
   (i) exposing a portion of the first imaging layer to radiation; and
   (ii) developing the first imaging layer such that the exposed portion dissolves to form the first patterned layer.

5. The method of claim 1, wherein the patterning step (e) includes the steps of:
   (i) exposing a portion of the second imaging layer to radiation; and
   (ii) developing the second imaging layer such that the exposed portion dissolves to form the second patterned layer.

6. The method of claim 1, wherein the patterning step (b) includes the step of exposing a portion of the first imaging layer to radiation through a mask.

7. The method of claim 1, wherein the patterning step (e) includes the step of exposing a portion of the second imaging layer to radiation through a mask.

8. The method of claim 1, wherein the stabilizing step (c) includes the step of using a PRIST technique to stabilize the first patterned layer.

9. The method of claim 1, wherein the stabilizing step (c) includes the step of using a silylation technique to stabilize the first patterned layer.

10. The method of claim 1, wherein the stabilizing step (c) includes:
    exposing the first patterned layer to radiation and
    heating the first patterned layer.

11. The method of claim 1, wherein the stabilizing step (c) includes exposing the first patterned layer to radiation having a wavelength in a range from approximately 200 nanometers to approximately 400 nanometers, and
    heating the first patterned layer at a temperature ramped to approximately 230 degrees Celsius.

12. The lithography method of claim 1, where the first and second features do not overlap.

13. A lithography method for semiconductor fabrication using a semiconductor wafer, comprising the steps of:
    (a) forming a first imaging layer over the semiconductor wafer;
    (b) patterning the first imaging layer in accordance with a first pattern to form a first patterned layer having a first disposable post;
    (c) stabilizing the first patterned layer;
    (d) forming a second imaging layer over the first patterned layer; and
    (e) patterning the second imaging layer in accordance with a second pattern to form a second patterned layer having a second disposable post, wherein the second patterned layer and the first patterned layer together form a single patterned layer, wherein the first and second disposable posts are formed relatively closer to one another than is possible through a single exposure to radiation.

14. The lithography method of claim 13, where the first and second features do not overlap.

15. A lithography method for semiconductor fabrication using a semiconductor wafer, comprising the steps of:
    (a) forming a first imaging layer over the semiconductor wafer;
    (b) patterning the first imaging layer in accordance with a first pattern to form a first patterned layer having a first feature;
    (c) stabilizing the first patterned layer;
    (d) forming a second imaging layer over the first patterned layer; and
    (e) patterning the second imaging layer in accordance with a second pattern to form a second patterned layer having a second feature, wherein the second patterned layer and the first patterned layer form a single patterned layer, the first and second features having a pitch which is not limited by a single exposure to radiation.

16. The lithography method of claim 15, where the first and second features do not overlap.

* * * * *